United States Patent [19]

Choudary et al.

[11] Patent Number: 4,611,091

[45] Date of Patent: Sep. 9, 1986

[54] CUINSE$_2$ THIN FILM SOLAR CELL WITH THIN CDS AND TRANSPARENT WINDOW LAYER

[75] Inventors: Uppala V. Choudary, Chatsworth; Yuh-Han Shing, Thousand Oaks; Richard R. Potter, Chatsworth; James H. Ermer, Los Angeles; Vijay K. Kapur, Northridge, all of Calif.

[73] Assignee: Atlantic Richfield Company, Los Angeles, Calif.

[21] Appl. No.: 678,854

[22] Filed: Dec. 6, 1984

[51] Int. Cl.$^4$ .................................. H01L 31/06
[52] U.S. Cl. ............................ 136/260; 136/264; 136/265; 136/256; 357/16; 357/30
[58] Field of Search .............. 136/260, 264, 265; 357/16, 30

[56] References Cited

U.S. PATENT DOCUMENTS 4,327,119 4/1982 Lis et al. .......................... 427/74

OTHER PUBLICATIONS

P. Petrou et al., *Appl. Phys. Lett.*, vol. 35, pp. 930–931 (1979).
R. R. Arya et al., *J. Vac. Sci. Technol.* vol. 20, pp. 306–307 (1982).

*Primary Examiner*—Aaron Weisstuch
*Attorney, Agent, or Firm*—Albert C. Metrailer

[57] ABSTRACT

A thin film photovoltaic device having first layer of copper indium selenide, a second layer of cadmium sulfide having a thickness less than 2500 angstroms, and a third layer of conducting wide bandgap semiconductor such as zinc oxide. The transparent third layer allows good transmission of blue light to the junction region while fully depleting the junction area to improve device voltage.

5 Claims, 1 Drawing Figure

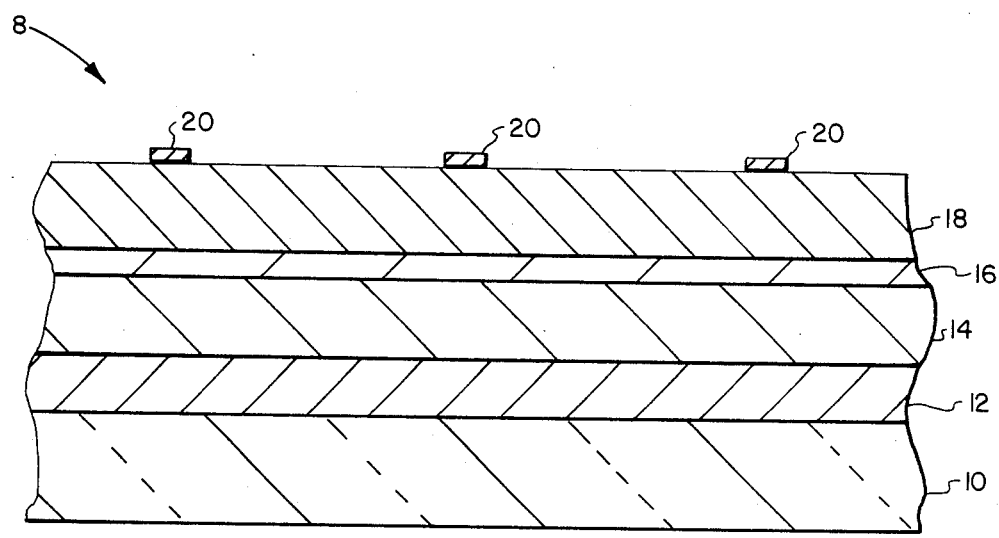

CUINSE$_2$ THIN FILM SOLAR CELL WITH THIN CDS AND TRANSPARENT WINDOW LAYER

BACKGROUND OF THE INVENTION

The present invention relates to thin film heterojunction solar cells formed from compound semiconductors, especially copper indium diselenide (CuInSe$_2$)-Cadmium Sulfide (CdS) solar cells and more particularly to an improved cell having a relatively thin n-type layer, e.g. cadmium sulfide, and a current collecting layer formed from a substantially conductive wide bandgap semiconductor material.

The background of copper indium selenide-cadmium sulfide solar cells is discussed in considerable detail in U.S. Pat. No. 4,335,266 issued to Mickelsen, et al. on June 15, 1982, which patent is hereby incorporated by reference for all purposes. As generally discussed in this reference, this type of solar cell has been seen by many as a viable alternative solar cell. The efficiency of such compound semiconductor solar cells has been gradually increased as improvements have been made. In addition they offer the opportunity of reduced manufacturing costs.

As taught in the Mickelsen patent, the cadmium sulfide layer, generally the n-type portion of the device, has been formed in two distinct regions. The first is a 0.5 to 1.5 micron layer of undoped cadmium sulfide which necessarily has a high resistivity. Superimposed on the high resistivity region is an indium doped layer of cadmium sulfide having a thickness of from 2 to 4 microns. This doped region has much higher conductivity and therefore forms an improved current collecting layer while providing the necessary electronic characteristics to the cadmium sulfide layer near the p-n junction.

The basic improvement taught by Mickelsen involves a new method for forming the copper indium selenide layer so as to not have an adverse effect upon the cadmium sulfide layer when deposited. By thus avoiding degradation of the cadmium sulfide layer, Mickelsen provides an improved solar cell both in terms of efficiency and the reproducability which would be required for commercial production. However, for such devices to be competitive with known single crystal silicon devices and the existing thin film silicon devices, further efficiency improvements are needed.

SUMMARY OF THE INVENTION

We have discovered that a substantial loss of efficiency in the Mickelsen type of cell is caused by absorption of incoming light in the relatively thick cadmium sulfide layer through which the light must pass before reaching the active junction area. We have found that significant efficiency improvements can be achieved by replacing a substantial portion of the conventional cadmium sulfide layer with an essentially transparent conductive material selected to have appropriate electronic characteristics required to provide desirable depletion characteristics in the active junction area.

Accordingly, a photovoltaic device according to the present invention comprises a first thin film layer of p-type semiconductor material which forms a junction with cadmium sulfide or cadmium zinc sulfide, e.g. copper indium diselenide, a second thin film layer of n-type cadmium sulfide or cadmium zinc sulfide semiconductor having a thickness of less than about 2500Å and preferably less than about 1500Å, and a third layer of substantially conducting wide bandgap n-type semiconductor material, e.g. zinc oxide, deposited upon the thin cadmium sulfide or cadmium zinc sulfide layer. The order of the layers may be reversed in a superstrate structure with no effect on the result.

DESCRIPTION OF THE DRAWINGS

The present invention may be better understood by reading the following detailed description of the preferred embodiments with reference to the accompanying single FIGURE, which is a cross-sectional view, not to scale, of a portion of a thin film solar cell according to the present invention.

DESCRIPTION OF THE PREFERRED EMBODIMENTS

With reference now to the FIGURE, there is provided a cross-sectional illustration of a portion of a solar cell 8 according to the present invention. Cell 8 is structurally supported on a glass substrate 10 which is about one to three millimeters thick. A back contact comprises a metal layer 12 deposited upon substrate 10. Layer 12 in the preferred embodiment is molybdenum having a thickness of about one to two microns. The first active region of the device 8 comprises a semconductor layer 14 which in the preferred embodiment is p-type copper indium diselenide having a thickness of about one to two microns. A thin layer 16 of n-type compound semiconductor comprising cadmium sulfide is positioned on layer 14. Layer 16 has a thickness of from 100 to 2500 angstroms, preferably from 100 to 1500 angstroms. A layer 18 of conducting wide bandgap n-type semiconductor material 18 is positioned on layer 16. In the preferred embodiment, layer 18 is formed primarily of zinc oxide and has a thickness of from 0.1 to 2 microns. The device is completed by a series of front face contacts 20 in the form of narrow metal strips which may be, for example, aluminum, deposited by sputtering, evaporation or plating.

While copper indium selenide is used as the first active layer 14 in the preferred embodiment it will be appreciated that other materials may be used. For example, layer 14 may be any other p-type semiconductor material which forms a junction with cadmium sulfide or cadmium zinc sulfide, such as Cu$_2$S, CdTe, and other group I-III-VI$_2$ ternary compounds. In addition, it is known that copper indium diselenide may be alloyed with aluminum, gallium, or sulfur, e.g. to adjust bandgaps, and such alloyed materials would be equivalent to copper indium diselenide for the purposes of this invention.

While cadmium sulfide and cadmium zinc sulfide are the preferred materials for the n-type compound semiconductor layer 16 we believe that most of the n-type group II-VI compound semiconductors would be equivalent for purposes of the present invention. In particular zinc selenide and cadmium selenide should be useful as n-type layer 16.

While zinc oxide (ZnO) was used for layer 18 in the preferred embodiment, it will be appreciated that other similar materials which are transparent in the visible range from 300 to 1300 nm wavelength should also be suitable. For the purposes of this invention the term wide bandgap means that the material is substantially transparent within at least this range of wavelengths. Thus, other conducting wide bandgap n-type semiconductors such as indium tin oxide, tin oxide (SnO$_2$), cadmium stannate (CdSnO$_4$), zinc stannate (ZnSnO$_4$), zinc selenide (ZnSe), cadmium selenide (CdSe), and alloys of these materials should be useful also.

The particular methods used in building the structure shown in the FIGURE are not critical to achieving the improved device performance realized by the present invention. Methods such as those taught by Mickelsen et al can be employed if desired and have been found to provide the best electrical performance. Various chemical deposition processes, e.g. electroplating, may also be useful and offer possible cost savings but have not provided the best electrical performance.

For example, in the preferred embodiments of the present invention, the cadmium sulfide layer 16 was deposited by conventional evaporation processes in a vacuum system. However, it is believed that known solution deposition methods for the CdS layer 16 may have cost advantages in a production situation.

Any of the materials referenced in the Mickelsen patent could have been employed for substrate 10. As indicated therein, the back electrical contact layer 12 is needed only if substrate 10 is an insulating material such as a ceramic or glass. A glass substrate 10 was used in the preferred embodiment due primarily to its low cost and ready availability.

Test devices of 4 cm$^2$ and 100 cm$^2$ area manufactured as described above have exhibited improved short circuit current and improvements in open circuit voltage are believed possible. The output current improvement is believed to be due primarily to an increase in the amount of blue light reaching the device junction. This has been corroborated by quantum efficiency data taken of test structures. Cadmium sulfide absorbs blue light, that is light having wavelengths ranging from approximately 300 to 520 nm. Thicknesses in excess of 2500 angstroms cause a substantial reduction in blue light reaching the junction thereby reducing the current output. Test devices with cadmium sulfide layers of thickness from 150 to 2500 angstroms exhibit photocurrents as much as 15% greater than test devices with thick, i.e. greater than 2500 angstroms, cadmium sulfide.

The high conductivity current collecting layer 18 can also affect the device field at the junction. A relatively thin cadmium sulfide or cadmium zinc sulfide layer may be fully depleted as a result. This can potentially yield increased open circuit voltages and therefore improve device performance.

While the present invention has been illustrated and described with reference to a particular structure and methods of manufacture, it is apparent there is modifications may be made therein within the scope of the appended claims.

What is claimed is:

1. A thin film photovoltaic device comprising a first layer of copper indium diselenide p-type semiconductor, a second layer in overlying contact with said first layer and formed of n-type cadmium sulfide semiconductor having a thickness of less than 2500Å, and a third layer in overlying contact with said second layer and formed of a substantially transparent degenerate wide bandgap n-type semiconductor.

2. A photovoltaic device according to claim 1 wherein said second layer has a thickness of from about 100Å to about 1500Å.

3. A photovoltaic device according to claim 1 wherein said third layer comprises primarily zinc oxide.

4. A photovoltaic device according to claim 1 wherein said third layer has sufficient conductivity to fully deplete said second layer.

5. A thin film photovoltaic device comprising a first layer of p-type copper indium diselenide, a second layer in overlying contact with said first layer and formed of an n-type group II-VI semiconductor which forms a junction with the first layer and having a thickness less than 2500 angstroms, and a third layer in overlying contact with said second layer and formed of a substantially conducting wide bandgap n-type semiconductor.

* * * * *